US010056481B2

(12) United States Patent
Schippel et al.

(10) Patent No.: US 10,056,481 B2
(45) Date of Patent: Aug. 21, 2018

(54) SEMICONDUCTOR DEVICE STRUCTURE

(71) Applicant: GLOBALFOUNDRIES Inc., Grand Cayman (KY)

(72) Inventors: Christian Schippel, Dresden (DE); Andrei Sidelnicov, Dresden (DE); Gerd Zschaetzsch, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/405,495

(22) Filed: Jan. 13, 2017

(65) Prior Publication Data

US 2018/0204944 A1    Jul. 19, 2018

(51) Int. Cl.
| | |
|---|---|
| *H01L 29/66* | (2006.01) |
| *H01L 29/78* | (2006.01) |
| *H01L 29/10* | (2006.01) |
| *H01L 29/06* | (2006.01) |
| *H01L 29/40* | (2006.01) |

(52) U.S. Cl.
CPC ...... *H01L 29/7824* (2013.01); *H01L 29/0649* (2013.01); *H01L 29/1083* (2013.01); *H01L 29/1095* (2013.01); *H01L 29/408* (2013.01)

(58) Field of Classification Search
CPC ............. H01L 29/7816; H01L 29/7824; H01L 29/0649; H01L 29/1083; H01L 29/1095; H01L 29/66681; H01L 29/408
USPC .................................................. 257/335, 339
See application file for complete search history.

(56) References Cited

U.S. PATENT DOCUMENTS

| | | | | |
|---|---|---|---|---|
| 8,053,319 B2* | 11/2011 | Liu | ...................... | H01L 27/0922 |
| | | | | 257/339 |
| 9,245,883 B1* | 1/2016 | Lin | ...................... | H01L 27/0886 |
| 2009/0008675 A1* | 1/2009 | Lu | .......................... | H01L 29/407 |
| | | | | 257/141 |
| 2013/0020632 A1* | 1/2013 | Disney | .................. | H01L 29/402 |
| | | | | 257/328 |
| 2014/0231908 A1* | 8/2014 | Chen | ................. | H01L 29/66681 |
| | | | | 257/336 |

(Continued)

OTHER PUBLICATIONS

Litty et al., "Dual Ground Plane EDMOS in Ultrathin FDSOI for 5V Energy Management Applications," 2014 IEEE.

*Primary Examiner* — Brook Kebede
(74) *Attorney, Agent, or Firm* — Amerson Law Firm, PLLC

(57) ABSTRACT

The present disclosure provides a semiconductor device structure including an active region having a semiconductor-on-insulator (SOI) configuration, a semiconductor device of lateral double-diffused MOS (LDMOS) type, a dual ground plane region formed by two well regions which are counter-doped to each other, the dual ground plane region extending below the semiconductor device, and a deep well region extending below the dual ground plane region. Herein, the semiconductor device of LDMOS type comprises a gate structure formed on the active region, a source region and a drain region formed in the active region at opposing sides of the gate structure, and a channel region and a drift region, both of which being formed in the active region and defining a channel drift junction, wherein the channel drift junction is overlain by the gate structure.

20 Claims, 7 Drawing Sheets

(56) References Cited

U.S. PATENT DOCUMENTS

2015/0116029 A1\* 4/2015 Litty .................. H01L 29/1079
                                                                                           327/534
2015/0243780 A1\* 8/2015 Lin ..................... H01L 29/7823
                                                                                           257/339

\* cited by examiner

SEMICONDUCTOR DEVICE STRUCTURE

BACKGROUND

1. Field of the Disclosure

The present disclosure relates to semiconductor device structures at advanced technology nodes, such as 28 nm and beyond.

2. Description of the Related Art

As the world becomes more and more integrated through billions of connected devices, many emerging applications demand a new approach to semiconductor innovation. The chips that make these applications possible are evolving into mini-systems, with increased integration of intelligent components including wireless connectivity, non-volatile memory and power management, all while driving ultra-low power consumption. Current efforts aim at developing new standards for system integration, providing an optimized platform for combining various different applications, such as radio frequency (RF), analog, embedded memory and advanced logic onto a single chip, requiring a wide range of dynamic voltage scaling and unmatched design flexibility via software-controlled transistors capable of delivering peak performance when and where it is needed, while balancing static and dynamic power for the ultimate in energy efficiency.

Actually, with the internet of things (IoT) or internet of everything becoming a term that is more and more popular, IoT promises a vast field of application in medical, automotive, industrial, metrology, fitness and more applications. These different applications largely have several requirements in common, such as cost sensitivity, long battery life and, increasingly, wireless connectivity. Particularly, the latter requirement of wireless connectivity demands wireless interfaces requiring RF leading to integrating critical RF SoC (System on Chip) functionality into products. Accordingly, a technology is demanded which is designed for advanced generations of connected devices that require low standby power and long battery life, integrated with RF/wireless functionality, and which is enabled with key RF features, including core and I/O (1.5V/1.8V) transistor RF models along with 5V lateral double-diffused MOS transistor (LDMOSFET) devices, simplifying present RF SoC designs.

Due to the above outlined situation, LDMOSFET devices have been increasingly applied in high voltage and smart power applications with laterally flowing current over the last years. The advantages over vertical double-diffused MOSFETs (VDMOSFETs) are a reduction in the number of application steps, multiple output capability on the same chip and compatibility with advanced very large scale integration (VLSI) technologies. LDMOSFETs with VLSI processes are expected to drive ICs to wider fields of complex applications, such as intelligent power ICs.

However, the breakdown voltage is reduced in LDMOS and VDMOSFETs due to the possibility of vertical and horizontal breakdown. Moreover, self-heating is much higher than for devices fabricated in bulk silicon due to the thermal isolation of $SiO_2$.

The integration of pure slave LDMOSFETs makes extensive use of logic device construction elements, such as forming well regions in the device body, forming complementary well regions for the drain drift region and the formation of source/drain regions, either by implanting the source/drain regions or epitaxially growing source/drain regions.

In view of the above discussion of the related art, it is desirable to provide a semiconductor device structure with a semiconductor device of an LDMOS type at advanced technology nodes, e.g., at 22 FDSOI techniques, allowing the reduction of the on resistance, that is, the resistive behavior between drain and source terminals of an LDMOS device, while at least maintaining, if not increasing, the breakdown voltage of the semiconductor device.

SUMMARY OF THE DISCLOSURE

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In accordance with an aspect of the present invention, a semiconductor device structure is provided. In accordance with illustrative embodiments herein, the semiconductor device structure includes an active region having a semiconductor-on-insulator (SOI) configuration, a semiconductor device of lateral double-diffused MOS (LDMOS) type, a dual ground plane region formed by two well regions which are counter-doped to each other, the dual ground plane region extending below the semiconductor device, and a deep well region extending below the dual ground plane region. Herein, the semiconductor device of LDMOS type comprises a gate structure formed on the active region, a source region and a drain region formed in the active region at opposing sides of the gate structure, and a channel region and a drift region, both of which being formed in the active region and defining a channel drift junction, wherein the channel drift junction is overlain by the gate structure.

BRIEF DESCRIPTION OF THE DRAWINGS

The disclosure may be understood by reference to the following description taken in conjunction with the accompanying drawings, in which like reference numerals identify like elements, and in which.

Figure 1:
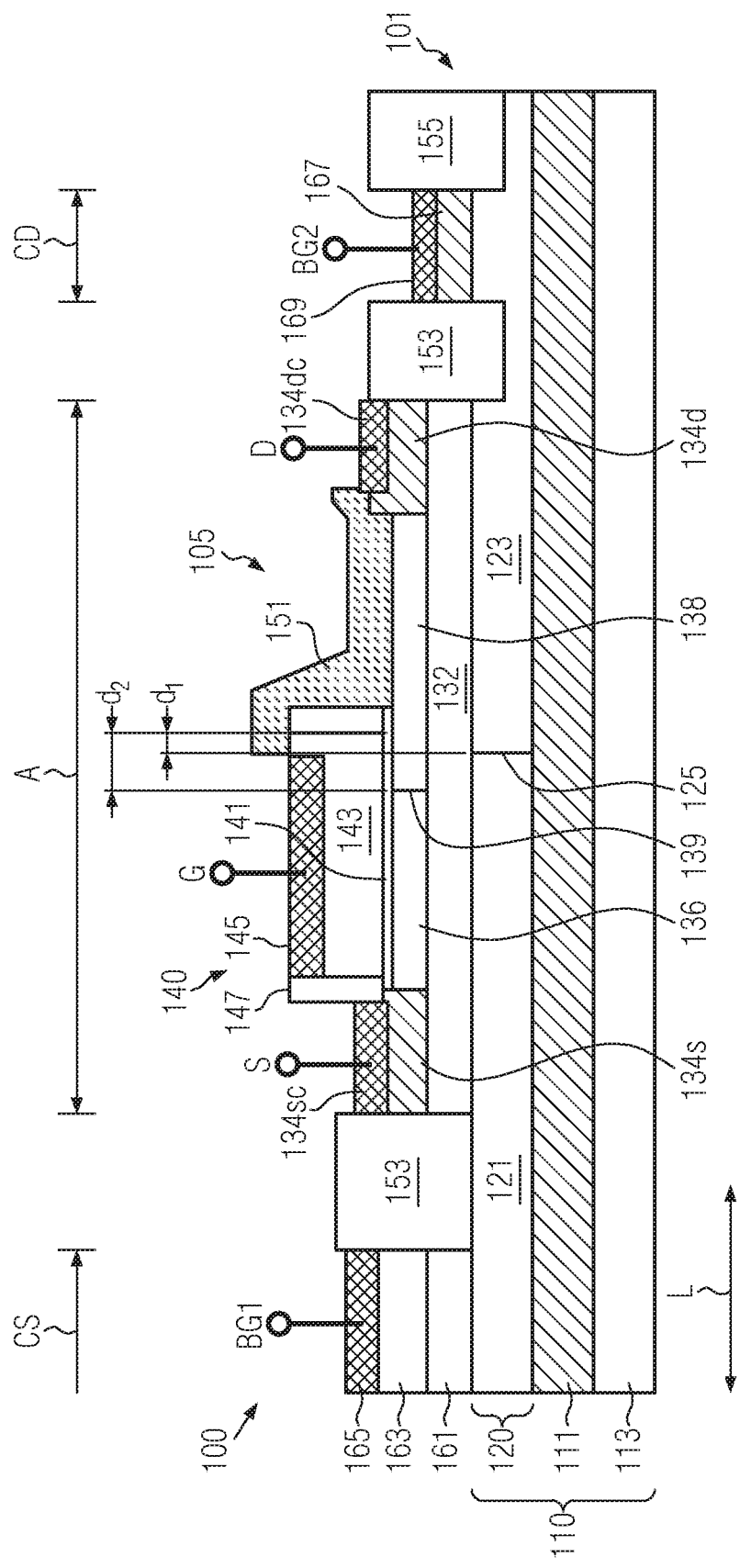
FIG. 1 schematically illustrates a semiconductor device structure in accordance with illustrative embodiments of the present disclosure.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios and numerical properties of ingredients, reaction conditions and so forth used in the specification and claims are to be understood as being modified in all instances by the term "about."

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

Semiconductor devices, such as PMOS and NMOS devices, of the present disclosure may concern structures which are fabricated by using advanced technologies, i.e., the semiconductor devices may be fabricated by technologies applied to approach technology nodes smaller than 100 nm, for example, smaller than 50 nm or smaller than 35 nm, e.g., at 22 nm or below. The person skilled in the art will appreciate that, according to the present disclosure, ground rules smaller or equal to 45 nm, e.g., at 22 nm or below, may be imposed. The person skilled in the art will appreciate that the present disclosure proposes capacitor structures having minimal length dimensions and/or width dimensions smaller than 100 nm, for example, smaller than 50 nm or smaller than 35 nm or smaller than 22 nm. For example, the present disclosure may provide structures fabricated by using 45 nm technologies or below, e.g., 22 nm or even below.

The person skilled in the art will appreciate that, although a semiconductor device may be provided by a MOS device, the expression "MOS" does not imply any limitation, i.e., a MOS device is not limited to a metal-oxide-semiconductor configuration, but may also comprise a semiconductor-oxide-semiconductor configuration and the like.

Regarding the wording "on," "over" and the like, no limitation is intended and upon stating that "an element A is on an element B," the elements A and B may be in direct contact or may have at least one further element C formed in between. Accordingly, wordings such as "under," "below" and the like are not to be taken as limiting the present disclosure to the case that an element A is in direct contact with an element B formed below or under the element A, but that at least one further element C may be formed in between.

FIG. 1 schematically illustrates a semiconductor device structure 100 in accordance with some illustrative embodiments of the present disclosure, the semiconductor device structure 100 comprising a semiconductor-on-insulator (SOI) substrate 101.

The SOI substrate 101 is provided in accordance with an SOI configuration, generally comprising an active layer, a buried insulating material layer and a base substrate, the buried insulating material layer being interposed between the active layer and a base substrate 110, e.g., a semiconductor material employed as a substrate, such as a silicon substrate or silicon germanium substrate or germanium substrate or silicon comprising substrate. In accordance with some illustrative embodiments of the present disclosure, the SOI substrate 101 may be provided in accordance with fully-depleted SOI (FDSOI) techniques, in which the active layer may have a thickness of 20 nm or less, the buried insulating material layer may have a thickness of about 145 nm or, in accordance with advanced techniques, the buried insulating material layer may have a thickness in a range from about 10-30 nm. In some special examples herein, the active layer may have a thickness of about 6-10 nm.

The SOI substrate 101 may be may be provided in accordance with known techniques, such as SIMOX techniques or smartcut processes.

With regard to FIG. 1, the semiconductor device structure 100 comprises an active region A which is provided with the SOI configuration, the active region A being formed on the base substrate 110. The active region A will be explained later in greater detail.

In accordance with some illustrative embodiments of the present disclosure, the base substrate 110 is configured as follows. At an upper surface portion of the base substrate 110, a dual ground plane region 120, a deep well region 111, and a remaining body 113 of the base substrate are formed. The remaining body 113 of the base substrate may be undoped or, alternatively, the remaining body 113 may be lightly doped, e.g., lightly P-doped or lightly N-doped. For example, a base substrate may be initially characterized as a P-doped silicon wafer having a homogenous doping in a range of about 1 to $10 \times 10^{14}/cm^3$ and having an upper surface with an orientation in accordance with (100).

As schematically illustrated in FIG. 1, the dual ground plane region 120 may comprise a well region 121 and a well region 123, the well regions 121 and 123 being counter-doped with respect to each other such that a ground plane junction 125 is defined at the interface of the two well regions 121 and 123. Furthermore, each of the two well regions 121 and 123 partially extends below the active region A such that the ground plane junction 125 is disposed below the active region A or overlain by the active region A.

In accordance with some illustrative embodiments of the present disclosure, the deep well region 111 is formed below the dual ground plane region 120 and between the dual ground plane region 120 and the remaining body 113 of the base substrate. The deep well region 111 may be in direct contact with the dual ground plane region 120, that is, the deep well region 111 may be formed directly below the dual ground plane region 120.

In accordance with some illustrative embodiments of the present disclosure, the deep well region 111 may be doped with the dopants of P-type conductivity or N-type conductivity.

In accordance with some illustrative examples, the deep well region 111 may have a doping concentration in the range of about $10^{16}$-$10^{17}$ cm$^{-2}$. For example, the deep well region 111 may be formed at a depth relative to an upper surface level of the base substrate 110 that is relative to an upper surface level of the dual ground plane region 120 of about 500-1000 nm.

In accordance with some illustrative embodiments of the present disclosure, the deep well region 111 may be formed by subjecting the base substrate 110 to an implantation process for implanting dopants into the base substrate 110 at a predetermined depth, wherein the deep well region 111 is formed. Prior or subsequent to the formation of the deep well region 111, the dual ground plane region 120 may be formed by performing an implantation sequence comprising patterning an upper surface region of the base substrate 110, performing a first implantation step for implanting one of the two well regions 121 and 123 in the base substrate 110, removing the masking pattern and applying another masking pattern for exposing the other one of the two well regions 121 and 123, and performing another implantation step for forming the other one of the two well regions 121 and 123. The person skilled in the art will appreciate that one of the two well regions 121 and 123 will have the same conductivity type as the deep well region 111.

In accordance with some illustrative embodiments of the present disclosure, implantation energies which may be used when implanting the deep well region 111 are greater than implantation energies used when implanting the dual ground plane region 120.

In accordance with some illustrative embodiments of the present disclosure, the base substrate 113 may be provided with an initial doping, e.g., may be initially P-doped. In this case, the deep well region 111 may have a conductivity type opposite to the conductivity type of the doping of the base substrate 110. Accordingly, the deep well region 111 may be counter-doped with regard to the remaining body 113 of the base substrate 110 and the dual ground plane region 120 may be isolated against the remaining body 113 of the base substrate 110 below the deep well region 111. The person skilled in the art will appreciate that leakage from the dual ground plane region 120 to the remaining body 113 of the base substrate 110 may be reduced, if not prevented.

Subsequent to a preparation of the base substrate 110 in the manner as described above, e.g., subsequent to the formation of the dual ground plane region 120 and the deep well region 111, the active region A may be formed.

In accordance with some illustrative embodiments of the present disclosure, the SOI substrate 101 may be initially provided. The SOI substrate 101 may be exposed to plural implantation processes, wherein an implantation is performed into the base substrate 110, wherein the dual ground plane region 120 and the deep well region 111 are formed as indicated above. Subsequently, the SOI substrate 101 may be exposed to a process for defining the active region A in an upper surface region of the SOI substrate 101 by forming an insulating structure 153 in the active layer and the buried insulating material of the SOI substrate.

In accordance with some illustrative embodiments of the present disclosure, the insulating structure 153 may be provided in accordance with shallow trench isolation (STI) techniques, according to which a trench (not illustrated) is etched into the active layer of the SOI substrate 101 and the buried insulating material layer of the SOI substrate, after which the trench is filled with an insulating material such that the insulating structure 153 is formed.

In accordance with some illustrative embodiments of the present disclosure, the insulating structure 153 may be patterned to delineate the active region A, e.g., the insulating structure 153 may laterally enclose the active region A and electrically insulate the active region A from surrounding portions of the SOI substrate. For example, the insulating structure 153 may completely extend through the active layer and at least partially extend into the buried insulating material below the active layer. The person skilled in the art will understand that the active layer of the SOI substrate may be electrically insulated from surrounding active layer portions.

After a complete reading of the present disclosure, the person skilled in the art will appreciate that, with regard to FIG. 1, the SOI configuration of the SOI substrate 101 is schematically illustrated in the active region A by means of the base substrate 110, a buried insulating material portion 132 being disposed on the base substrate 110, and an active layer portion which is schematically depicted by the set of reference numerals 134s, 136, 138 and 134d.

In accordance with some illustrative embodiments of the present disclosure, the insulating structure 153 may be formed by silicon oxide material and/or silicon nitride material.

In accordance with some illustrative embodiments of the present disclosure, the buried insulating material portion 132 may be formed by silicon oxide material or silicon nitride material.

In the following, the active region A will be described in greater detail. Herein, a gate structure 140 is formed on the active region A.

In accordance with some illustrative embodiments of the present disclosure, the gate structure 140 may comprise a gate dielectric 141, e.g., comprising a dielectric material, such as a high-k material and/or silicon oxide, as well as an optional work function adjusting material, such as TiN and the like. The gate structure 140 may further comprise a gate electrode 143, e.g., formed by polysilicon, amorphous silicon or a metal material as employed as a gate electrode material in the art. This does not pose any limitation to the present disclosure and the person skilled in the art will appreciate that the gate electrode 143 may be formed in accordance with gate last or gate first approaches. In accordance with some particularly illustrative examples, the gate electrode material 143 may be provided by means of fully silicidation (FUSI) techniques.

Referring to FIG. 1, the gate electrode material 143 may be contacted by a gate contact portion 145, e.g., a silicide material portion, which is coupled to a gate contact G. Sidewalls of the gate electrode material 143 may be covered by sidewall spacer structure 147, comprising at least one sidewall spacer.

In accordance with some illustrative embodiments of the present disclosure, the gate electrode material 143 may have a length of at least 100 nm, the length being taken along a length direction L as indicated by the double-arrow in FIG. 1. In accordance with some illustrative embodiments of the present disclosure, the gate electrode material 143 may have a length in a range from about 200-1500 nm. This does not pose any limitation to the present disclosure and the person skilled in the art will appreciate that a length of the gate electrode material 143 may be smaller than 100 nm.

In accordance with some illustrative embodiments of the present disclosure, the gate electrode material 143 may be formed in alignment with the active region A and in alignment with the ground plane junction 125 such that there is an overlap greater than zero of the gate electrode material 143 relative to the ground plane junction 125. That is, the gate electrode material 143 may be formed such that the ground plane junction 125 is overlain by the gate electrode material 143 by an overlap length which is schematically indicated by $d_1$ in FIG. 1: $d_1>0$, e.g., $d_1$ may be equal to or greater than about 10 nm.

In accordance with the illustration in FIG. 1, the semiconductor device 105 formed in and above the active region A further comprises a source region 134s and a drain region 134d which are formed in the active region A at opposing sides of the gate structure 140. Particularly, the source region 134s and the drain region 134d are formed at opposing ends of the active layer portion which corresponds to an intersection of the active region A and the active layer of the SOI substrate 101, this is, the active layer portion that extends within the active region A between the insulating structures 153.

Referring to FIG. 1, a channel region 136 may be formed within the active region A at one side of the source region 134s. At one side of the channel region 136, opposite the source region 134s, a drift region 138 extending between the channel region 136 and the drain region 134d within the active layer portion is provided. The drift region 138 may be formed by lightly doping the active layer portion within the active region A with dopants of the same type as used for doping the source region 134s and the drain region 134d. In accordance with illustrative examples of the present disclosure relating to a semiconductor device 105 of the NLDMOS type, the source and drain regions 134s and 134d may be doped with dopants of N-type conductivity, and the drift region 138 may be lightly doped relative to the source and drain regions 134s and 134d by dopants of N-type conductivity. In accordance with other illustrative examples of the present disclosure relating to a PLDMOS type semiconductor device 105, the source and drain regions 134s and 134d may be doped with dopants of P-type conductivity, and the drift region 138 may be lightly doped relative to the source and drain regions 134s and 134d by dopants of P-type conductivity.

In accordance with some illustrative embodiments of the present disclosure, the channel region 136 may remain undoped and the channel region 136 may correspond to a portion of the active layer portion as present in the active region A without further doping. In other words, the channel region 136 may be protected by a masking pattern throughout process steps involved when forming the drift region 138 and the source and drain regions 134s, 134d.

Referring to FIG. 1, a channel-drift junction 139, being defined as an interface between the channel region 136 and the drift region 138, may be provided in the active layer portion within the active region A such that the channel-drift junction 139 is overlain by the gate structure 140, that is, an overlap length $d_2$ as schematically indicated in FIG. 1 between the gate structure 140 and, particularly, the gate electrode material 143 and the channel-drift junction 139 is positive ($d_2>0$). In accordance with some illustrative examples herein, the overlap length $d_2$ may be in a range from about 50-200 nm. The overlap length $d_2$ defines, in other words, a dimension of how much the drift region 138 is overlain by the gate structure 140, particularly the gate electrode material 143.

In accordance with some illustrative embodiments of the present disclosure, a length of the channel region 136 taken along the length direction L may be greater than about 100 nm. In accordance with some special illustrative examples herein, the length of the channel region 136 may be in a range from about 150-1500 nm.

In accordance with some illustrative embodiments of the present disclosure, a spacing between the source and drain regions 134s, 134d may be in a range from about 150-1500 nm. This does not pose any limitation to the present disclosure and the person skilled in the art will appreciate that the spacing between the source and drain regions 134s, 134d may be smaller than 150 nm or greater than about 300 nm.

In accordance with some illustrative embodiments of the present disclosure, as depicted schematically in FIG. 1, the source and drain regions 134s, 134d may be provided by raised source and drain regions. In accordance with some illustrative examples herein, the source and drain regions 134s, 134d may be, at least partially, grown by epitaxial techniques and raising above an upper surface level of the channel region 136. An epitaxially grown raised source/drain region allows reducing the serious resistance of the source/drain regions 134s, 134d. In accordance with some illustrative embodiments of the present disclosure, the drift region 138 may be optionally formed by epitaxial growth techniques, as well. This does not pose any limitation to the present disclosure and the drift region 138 may instead be formed by an implantation.

In accordance with some illustrative embodiments of the present disclosure, an exposed upper surface of the drift region 138, that is, the portion of the drift region 138 that is not overlain by the gate structure 140, may be covered by a block layer 151, e.g., an oxide material or nitride material, to protect the exposed surface of the drift region 138 during subsequent silicidation when forming silicide contact regions 134sc, 134dc and the gate contact 145. The silicide contact 134sc on the source region 134s may be in contact with source contacts S. The silicide contact 134dc on the drain region 134d may be in contact with the drain contact D. In accordance with some illustrative embodiments of the present disclosure, the block layer 151 may partially overlap the gate structure 140 such that the gate contact 145 only partially covers the gate electrode material 143. For example, the block layer 151 may overlap the gate structure 140 and the drift region 138 in the range of 150-500 nm. In accordance with some special illustrative examples herein, the block layer 151 may be formed as a resist protect oxide (RPO). The person skilled in the art will appreciate that the block layer 151 may block silicide formation and may increase, or at least maintain, the resistivity of the drift region 138, allowing sustaining a high drain voltage, wherein the potential drop across the drift region 138 is adapted to ensure a suitable potential drop in the channel region 136 and the gate dielectric 141.

In accordance with some illustrative embodiments of the present disclosure, the insulating structure 153 may at most partially extend into the dual ground plane region 120 which extends below the buried insulating material portion 132 of the active region A. Laterally adjacent at an opposite side to the active region A, the active layer and the buried insulating material of the SOI substrate 101 may be removed to partially expose an upper surface of the dual ground plane region 120, i.e., upper surfaces of the two well regions 121 and 123 are partially exposed at a side of the insulating structure 153 in respective regions CS and CD.

In accordance with some illustrative embodiments of the present disclosure, the well region 121 representing a back gate to the channel region 136 and extending below the source region 134s may be electrically in contact with the region CS, thereby allowing electrically contacting the well region 121 outside of the active region A via a back gate contact BG1 being electrically in contact with a silicide contact 165, which in turn is electrically in contact with an optional strongly doped well region 163 of the same conductivity type as the well region 121 of the dual ground plane region 120, and an optional grown raised portion of the well region 121, representing an upper surface of the well region 121 contacting the well portion 136.

In accordance with some illustrative embodiments of the present disclosure, the well region 123 may be similarly in electrical contact with a back gate contact BG2 at the region CD, wherein the back gate contact BG2 electrically contacts a silicide region 169, a well portion 167 strongly doped with dopants of the same conductivity type as the well region 123. As indicated via an insulating structure 155, the region CD may be laterally enclosed, as well as the region CS, though not illustrated. Regarding the well 123, the well 123 therefore represents a back gate to the diffusion region 138.

After a complete reading of the present disclosure, the person skilled in the art will appreciate that the dual ground plane region 120 may serve as back gates to the semiconductor device 105. Herein, the well region 121 of the dual ground plane region 120 may be of opposite conductivity type relative to the source and drain regions 134s, 134d and the drift region 138. The well region 123 may be of the same conductivity type as the source and drain regions 134s, 134d and the drift region 138.

In accordance with some illustrative examples, upon considering the semiconductor device 105 as being of NLD-MOS type, the well region 121 may be of P-type conductivity, while the well region 123 is of the N-type conductivity. Herein, the well region 123 being of N-type conductivity allows applying a positive back bias to the drift region and the well region 121 allows ensuring a low leakage as it extends below the channel region 136. In this example, the positive back bias provided by the N-type well region 123 decreases the series resistance while accumulating electrons in the drift region 138. This effect may be caused by a back bias applied via the contact BG2 enabling spreading an electric field into the drift region 138 and reducing a peak in the electric field of the drain region 134d. Independent of any back bias applied via BG1 to the well region 121, a modulation of the back bias via BG2 does not impact a gate-channel performance of the semiconductor device 105 and an adjustment of the threshold voltage of the gate structure 140 via the back bias BG1. This example is not limiting by any means and the person skilled in the art will appreciate that the semiconductor device 105 may be taken as a PLDMOS type (the source and drain regions 134s, 134d, as well as the drift region 138 being of P-type), wherein the well region 121 may be of N-type conductivity, while the well region 123 may be of P-type conductivity.

With regard to FIGS. 2a-2f, example measurements as performed on semiconductor device structures in accordance with different illustrative embodiments of the present disclosure were performed by the inventors. These data must be understood as first silicon readout of a non-optimized device construction in early stage of technology readiness. Nevertheless, these data prove general device functionality.

Figure 2A:
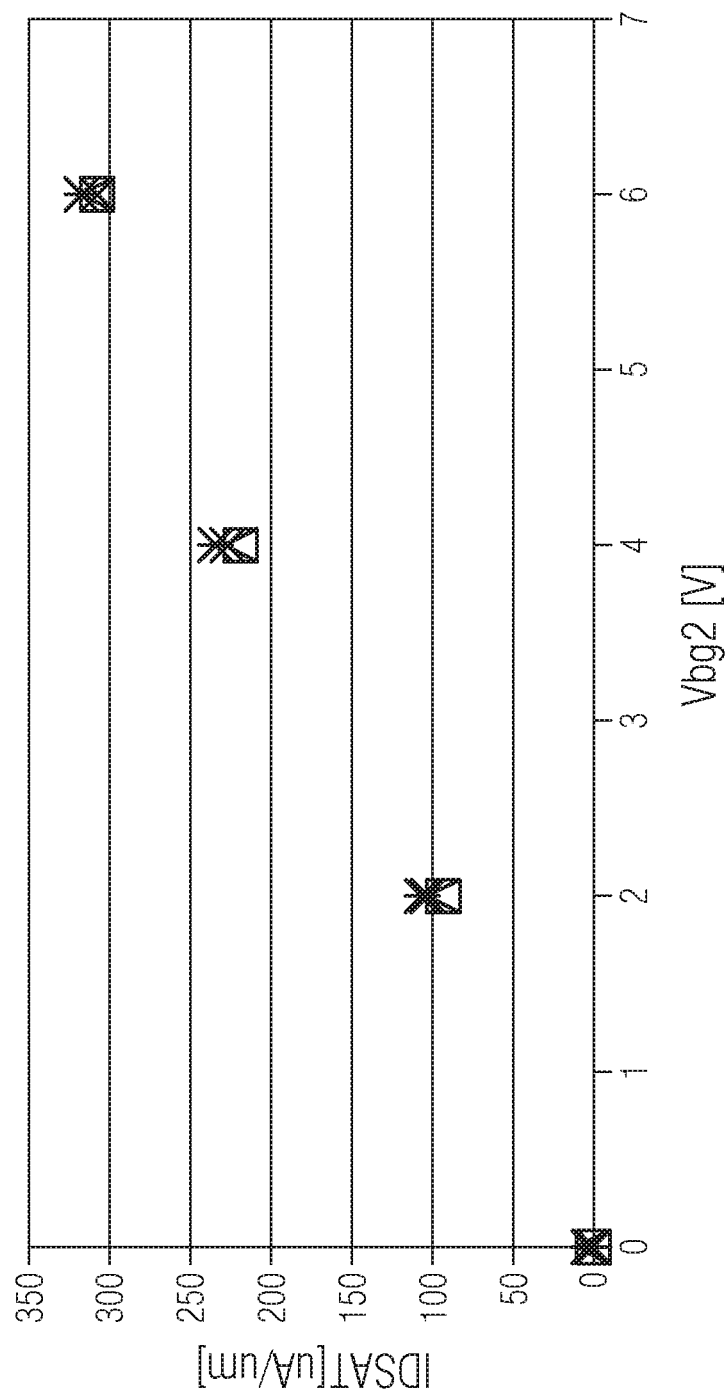
FIGS. 2a-2f schematically illustrate characteristics measured on semiconductor device structures of the present disclosure.

Dimensions of a device as being tested in accordance with some explicit illustrative embodiments, wherein the tested device may correspond to a semiconductor device of an exemplary semiconductor device structure as described above with regard to FIG. 1, had been as follows (without limiting the present disclosure to any explicitly disclosed value; explicit values are presented for illustrating some merits of the present disclosure):

Channel length (136) 350 nm
Gate/Drift Region overlap (d2) 150 nm
Gate/Backgate2 overlap (d1) 100 nm
Effective length of drift region (spacing of 143 to 134d): 300 nm
Device pitch of about 1.3 µm The backgates 121 and 123 did not overlap (length of 125=0 nm). The test conditions for the parameters provided were defined as follows:

Idsat: Id@Vgs=1.8V, Vds=3.3V
BV: Vds@Id=1nA/µm, Vgs=0
Idoff: Id@Vds=3.63V, Vgs=0
Vtlin: Vgs@Id=300*W/L, Vds=50 mV
Vtsat: Vgs@Id=300*W/L, Vds=3.3V FIG. 2a schematically illustrates measurements indicating a graphical representation of $I_{DSAT}$, representing the drain current at saturation for different back bias voltages applied via BG2 in FIG. 1, indicated along the abscissa in FIG. 2a as Vbg2. From the illustration in FIG. 2a, it is visible that the drain current in saturation increases with increasing back bias voltage applied via BG2 in FIG. 1. As shown in FIG. 2a, upon doubling the back bias from 2 volts to 4 volts, the saturation current more than doubled from about 100 microamps/micrometer to more than a current in between 200-250 microamps/micrometer, and upon increasing the back bias voltage three times from 2 volts to 6 volts, the saturation current is increased from 100 microamps/micrometer to about more than 300 microamps/micrometer.

Figure 2B:
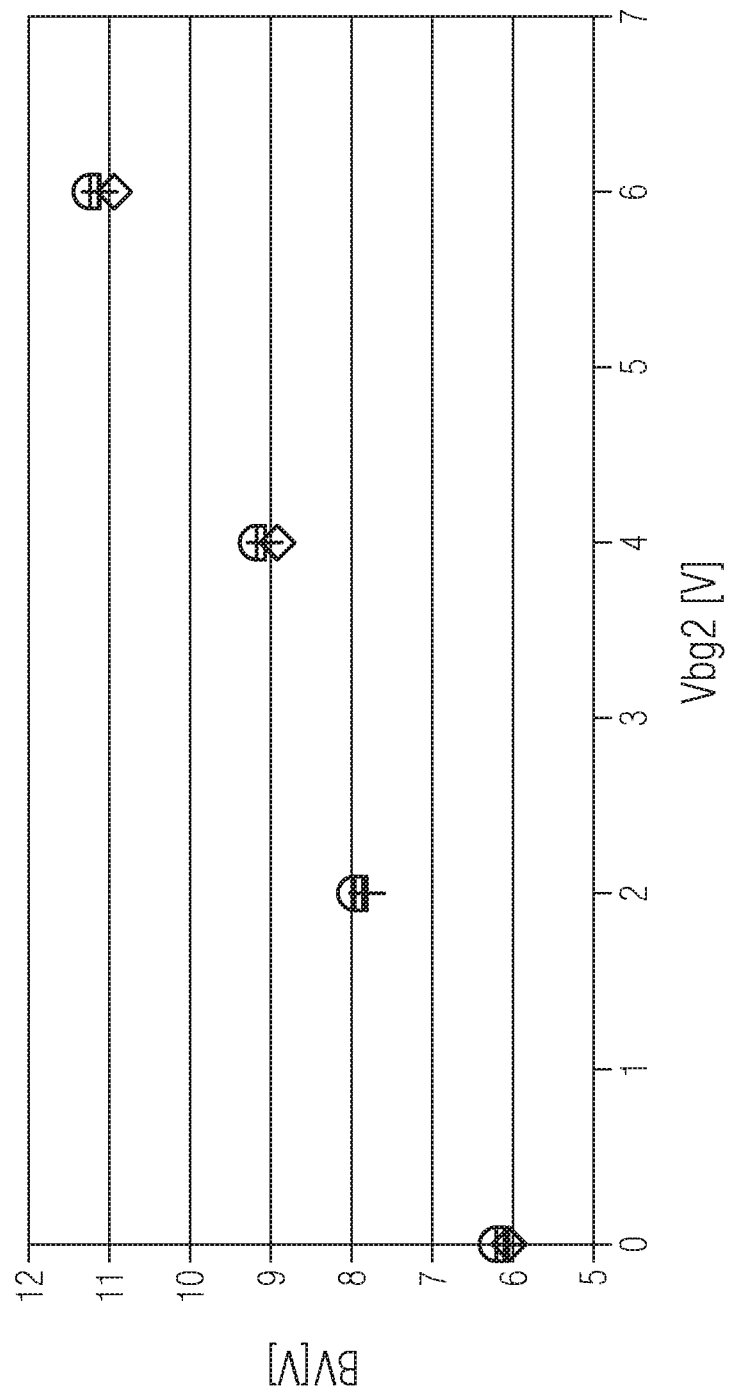

FIG. 2b schematically illustrates a graphical representation indicating a relationship between the breakdown voltage BV and the back bias applied via BG2 in FIG. 1 and indicated along the abscissa in FIG. 2b by means of Vbg2. Herein, the breakdown voltage BV increases upon increasing back bias Vbg2.

Figure 2C:
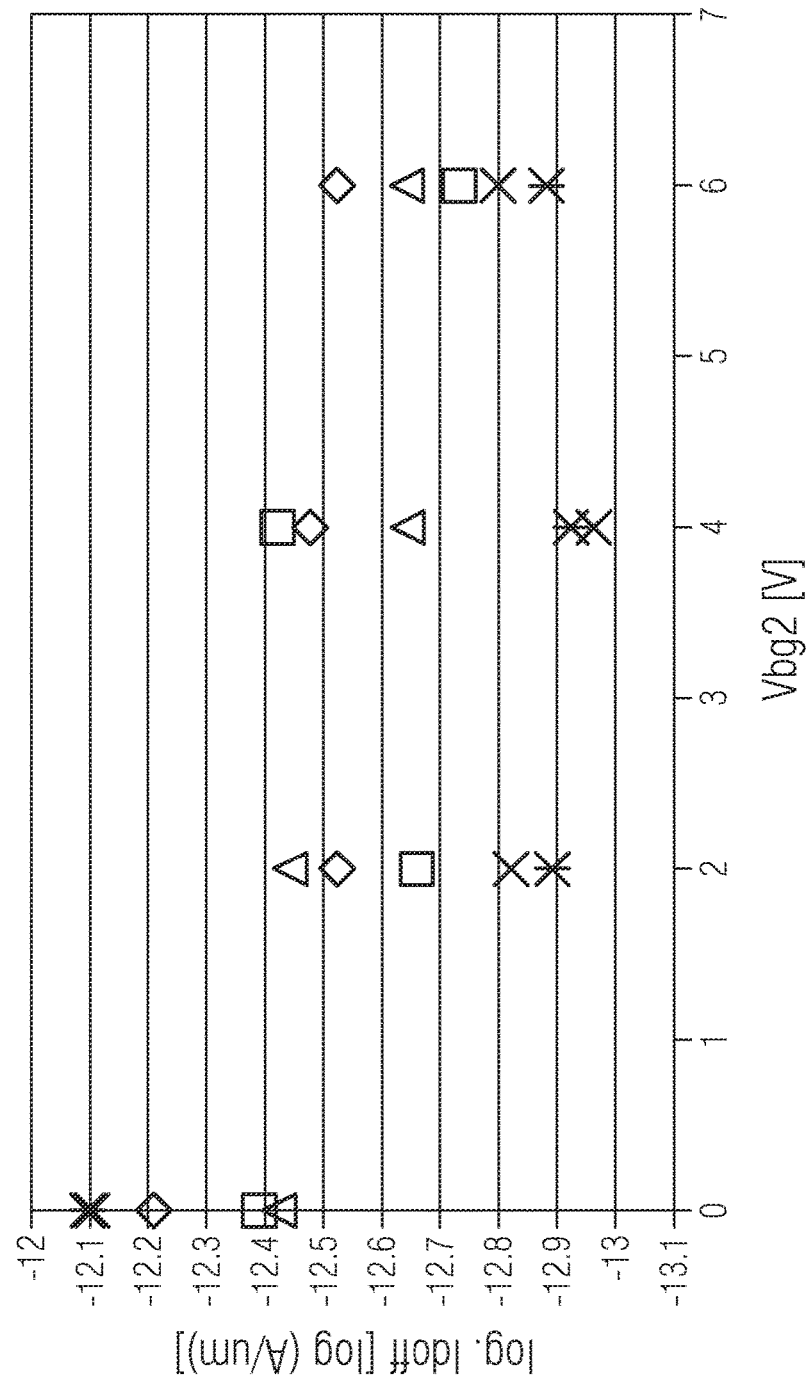

FIG. 2c schematically illustrates a semi logarithmic representation of a drain-off current at back bias via BG2 in FIG. 1 and indicated along the abscissa in FIG. 2c via Vbg2 at 0 volts, 2 volts, 4 volts and 6 volts. Increasing the back vias voltage has basically no effect on the drain off current Idoff.

Figure 2D:
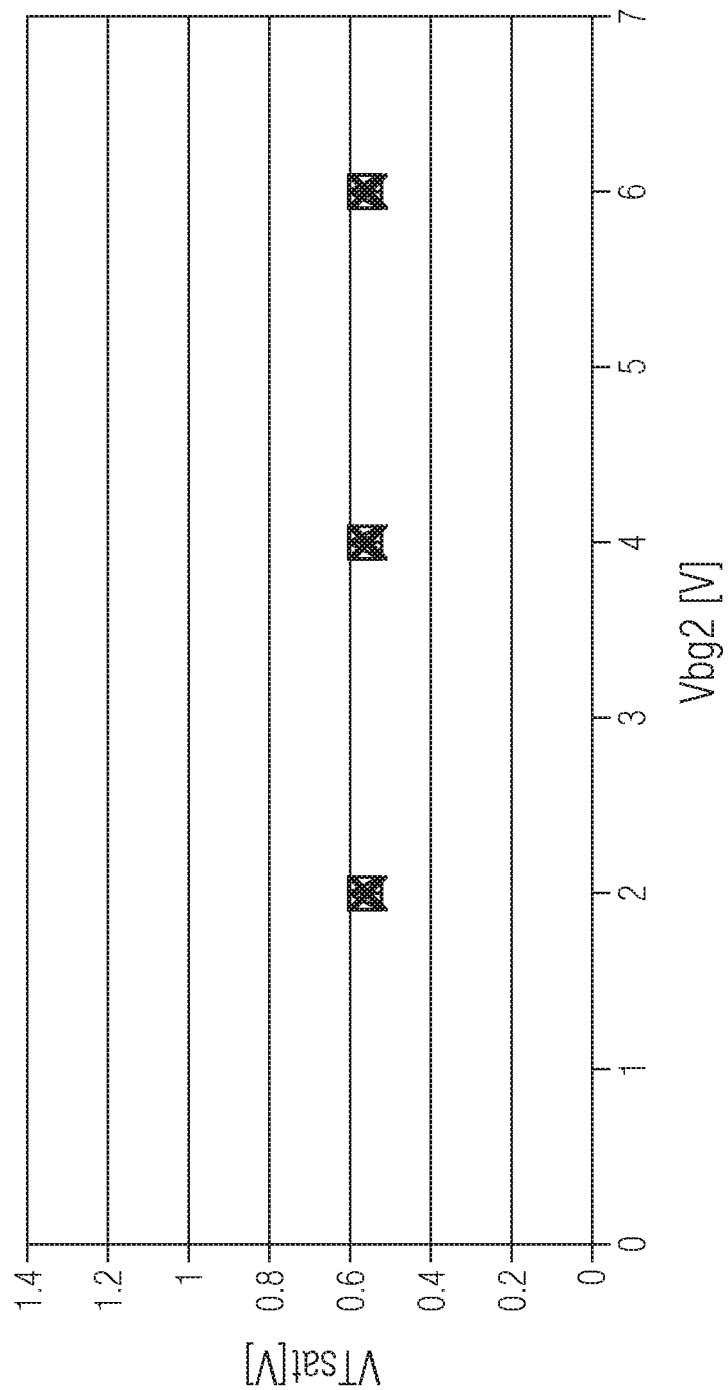

FIG. 2d schematically illustrates a graphical representation of the threshold voltage at saturation VTsat along the ordinate in FIG. 2d in dependence of the back bias Vbg2 applied via BG2 in FIG. 1. Increasing the back bias from 2 volts to 4 volts to 6 volts does not have any substantial effect on the threshold voltage in saturation VTsat.

Figure 2E:
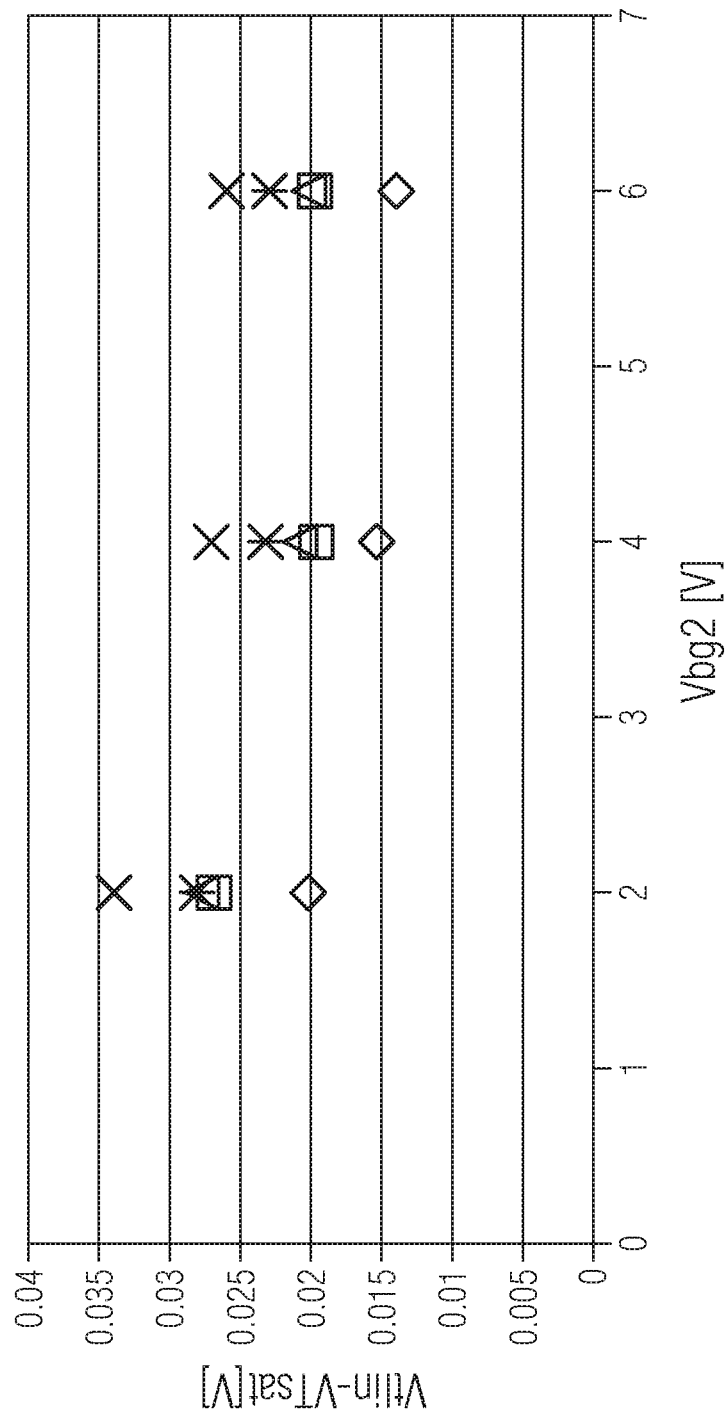

FIG. 2e schematically illustrates a graphical representation of the threshold voltage Vtlin-VTsat in dependence of the back bias Vbg2 applied via BG2 in FIG. 1. Increasing the back bias shows a small (DIBL—drain induced barrier lowering) effect on difference between the linear threshold voltage and the saturation threshold voltage in the range between 0.03-0.015 volts. Increasing the back bias voltage 4 to 6 volts seems to have a much reduced effect on the difference between the linear threshold voltage minus the saturation threshold voltage as compared to the threshold voltage difference at a back bias of 2 volts.

With regard to FIG. 2e, a graphical representation of the threshold voltage Vtlin in dependence of the back bias Vbg2 applied via BG2 in FIG. 1 is shown. In accordance with the previous paragraph, there is a very small dependency of the back bias on the linear threshold voltage and the threshold voltage shows a little tendency to decrease upon increasing back bias. Regarding the increase from 4 volts to 6 volts, almost no change in the linear threshold voltage is shown. As the saturation threshold voltage VTsat does not show a dependence on the back bias, while Vtlin shows a minor dependency, this behavior is reflected in the difference between the linear threshold voltage and the saturation voltage in FIG. 2e.

Figure 2F:
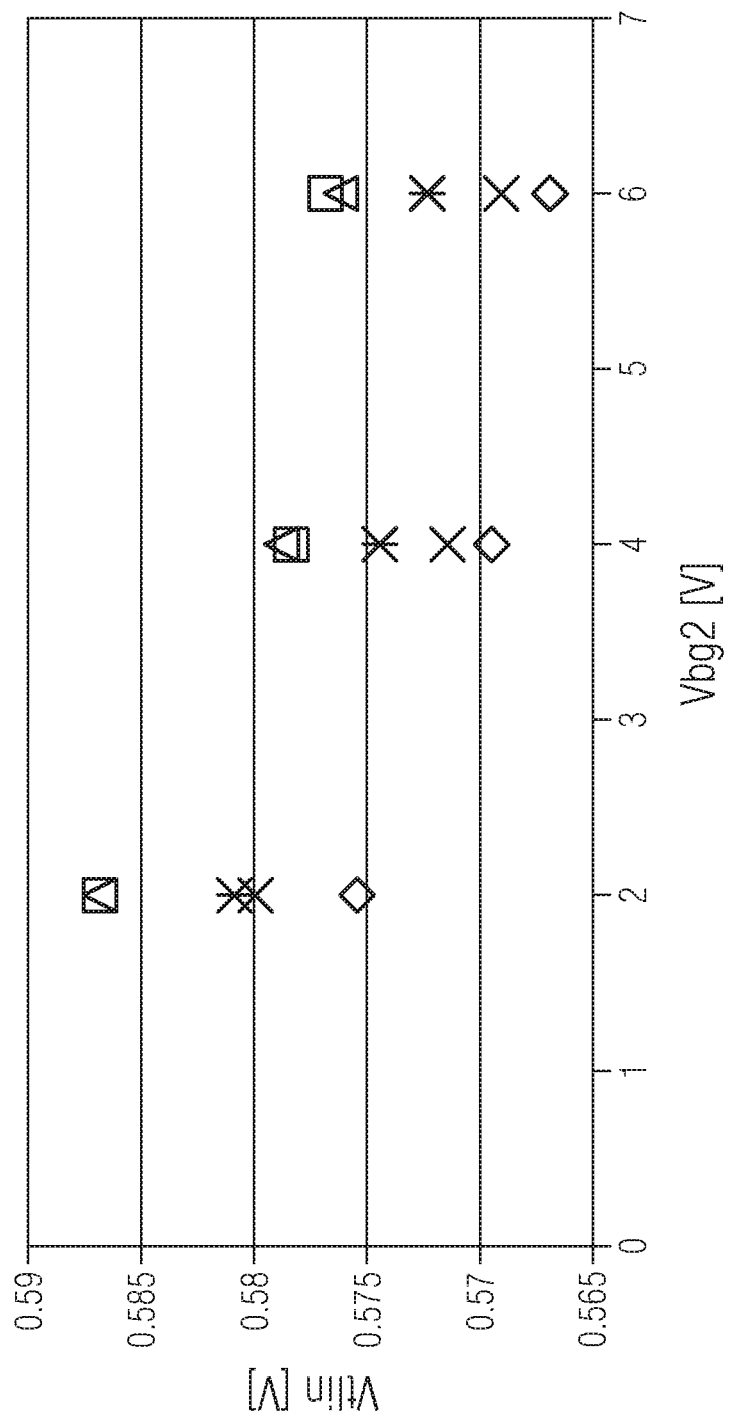

FIG. 2f schematically illustrates a graphical representation of the threshold voltage Vtlin-VTsat in dependence of the back bias Vbg2 applied via BG2 in FIG. 1. Increasing the back bias shows a small effect on the difference between the linear threshold voltage and the saturation threshold voltage in the range between 0.03-0.015 volts. Increasing the back bias voltage 4 to 6 volts seems to have a much reduced effect on the difference between the linear threshold voltage minus the saturation threshold voltage as compared to the threshold voltage difference at a back bias of 2 volts.

In accordance with some illustrative embodiments of the present disclosure, the semiconductor device structures may be configured to support drain side voltages of about 3.3 volts or 5 volts or higher.

In accordance with some illustrative embodiments of the present disclosure, the semiconductor device structures as described above may be configured to support a high breakdown voltage at advanced technology nodes, e.g., at 22 nm and beyond in FDSOI technologies.

In accordance with some illustrative embodiments of the present disclosure, semiconductor device structures comprising a semiconductor device of a lateral DMOS device type in SOI technologies, e.g., FDSOI technologies, featuring dual back gates via dual ground plane regions for applying a back bias to a doped active layer of an SOI substrate provided as a drift region are described. Herein, the semiconductor device may be featured as a pure slave device, using an IO-FET gate stack and one of a PVT and an NVT implant for the drift region, using a P-well or N-well back gate for VT control by means of a well region extending under the source region and the channel region, and using a back gate implemented as a well region of opposite conductivity type to the back gate for VT control in order to control the drift region.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A semiconductor device structure, comprising:
an active region having a semiconductor-on-insulator (SOI) configuration;
a lateral double-diffused MOS (LDMOS) semiconductor device, comprising:
a gate structure positioned above said active region;
a source region and a drain region positioned in said active region at opposing sides of said gate structure and having a first conductivity type; and
a channel region and a drift region, both of which are positioned in said active region and defining a channel-drift junction, wherein said channel-drift junction is overlain by said gate structure, and said drift region has said first conductivity type;
a dual ground plane region formed by two well regions which are counter-doped to each other, said dual ground plane region extending below said semiconductor device; and
a deep well region extending below said dual ground plane region, wherein said two well regions of said dual ground plane region define a ground plane junction and said deep well region extends laterally on both sides of said ground plane junction.

2. The semiconductor device structure of claim 1, wherein said ground plane junction is overlain by said gate structure.

3. The semiconductor device structure of claim 2, wherein said ground plane junction is overlain by said drift region.

4. The semiconductor device structure of claim 3, wherein an overlap length defining a dimension of how much said ground plane junction is spaced apart from a side surface of a gate electrode material of said gate structure facing towards said drain region is greater than or equal to about 10 nm.

5. The semiconductor device structure of claim 1, wherein said active region is formed by an active layer portion and an underlying buried insulating material portion, both of which are formed over a base substrate, said active layer portion and said buried insulating material portion being laterally enclosed by an insulating structure.

6. The semiconductor device structure of claim 5, wherein said source region, said drain region, said channel region and said drift region each extend within said active layer portion.

7. The semiconductor device structure of claim 5, wherein said insulating structure is formed by a shallow trench insulating (STI) structure which at most partially extends into said dual ground plane region.

8. The semiconductor device structure of claim 5, wherein said dual ground plane region extends below said insulating structure and is electrically connected to respective contact regions which are formed adjacent said insulating structure and outside said active region.

9. The semiconductor device structure of claim 8, wherein said contact regions are of opposite conductivity type, one of which being electrically insulated from said source region by means of said insulating structure and another of which being electrically insulated from said drain region by means of said insulating structure.

10. The semiconductor device structure of claim 1, further comprising a base substrate on which said active region is formed, an upper surface region of said base substrate comprising said dual ground plane region and said deep well region, wherein said base substrate is doped with P-type dopants of a first concentration outside of said dual ground plane region and said deep well region, wherein said deep well region is doped with N-type dopants of a second concentration greater than said first concentration.

11. The semiconductor device structure of claim 1, wherein said deep well region is formed by a layer of N-type dopants provided within a base substrate on which said active region is formed, wherein said dual ground plane region is formed at an upper surface portion of said base substrate.

12. The semiconductor device structure of claim 11, wherein a concentration of said N-type dopants of said deep well region is greater than about $10^{16}$ cm$^{-2}$.

13. The semiconductor device structure of claim 1, wherein said deep well region is formed at a depth relative to an upper surface of said active region of at least about 500 nm.

14. The semiconductor device structure of claim 1, wherein said gate structure comprises a polysilicon material having a length of greater than 100 nm.

15. The semiconductor device structure of claim 14, wherein said length is in a range from about 200-1500 nm.

16. The semiconductor device structure of claim 1, wherein a length of said channel region is greater than about 100 nm.

17. The semiconductor device structure of claim 16, wherein said length is in a range from about 150-1500 nm.

18. The semiconductor device structure of claim 1, wherein an overlap length defining a dimension of how much said drift region is overlain by a gate electrode material of said gate structure is in a range from about 50-200 nm.

19. The semiconductor device structure of claim 1, wherein a spacing between said source and drain region is in a range from about 150-1500 nm.

20. The semiconductor device structure of claim 1, further comprising a block layer partially overlapping said gate structure and said drift region adjacent to said gate structure in the range of 150-500 nm.

* * * * *

UNITED STATES PATENT AND TRADEMARK OFFICE
CERTIFICATE OF CORRECTION

PATENT NO. : 10,056,481 B2
APPLICATION NO. : 15/405495
DATED : August 21, 2018
INVENTOR(S) : Christian Schippel et al.

Page 1 of 1

It is certified that error appears in the above-identified patent and that said Letters Patent is hereby corrected as shown below:

In the Claims

Column 12, Line 4 (Claim 1), change "(SOT)" to -- (SOI) --.

Signed and Sealed this
Twenty-sixth Day of February, 2019

Andrei Iancu
*Director of the United States Patent and Trademark Office*